United States Patent [19]

Camlibel et al.

[11] Patent Number: 4,605,942

[45] Date of Patent: Aug. 12, 1986

[54] MULTIPLE WAVELENGTH LIGHT EMITTING DEVICES

[75] Inventors: Irfan Camlibel, Morris County; Aland K. Chin, Union County; Brymer H. Chin, Somerset County, all of N.J.

[73] Assignee: AT&T Bell Laboratories, Murray Hill, N.J.

[21] Appl. No.: 658,568

[22] Filed: Oct. 9, 1984

[51] Int. Cl.[4] .......................... H01L 33/00; H01S 3/19
[52] U.S. Cl. ........................................ 357/17; 357/81;
372/36; 372/45; 372/50; 350/96.15
[58] Field of Search ............... 372/50, 45, 36; 357/17,
357/81; 350/96.15

[56] References Cited

U.S. PATENT DOCUMENTS

| | | | |
|---|---|---|---|
| 4,159,452 | 6/1979 | Logan et al. | 372/45 |
| 4,278,949 | 7/1981 | Marschall et al. | 331/94.5 H |
| 4,440,470 | 4/1984 | Khoe | 357/17 |
| 4,476,563 | 10/1984 | Van Ruyven | 372/50 |

OTHER PUBLICATIONS

"Dual Wavelength Surface Emitting InGaAsP L.E.D.s," Electronics Letters, vol. 16, No. 22, T. P. Lee et al., 1980, pp. 845-846.
"A Transparent InGaAsP-InP Luminescent Diode for Optical Wavelength Multiplex Operation of Fiber Systems," IEEE Transactions on Electron Devices, vol. ED-30, No. 2, W. E. Proebster et al., pp. 119-122, 1983.

*Primary Examiner*—James W. Davie
*Assistant Examiner*—Georgia Y. Epps
*Attorney, Agent, or Firm*—Lester H. Birnbaum

[57] ABSTRACT

Presented is a dual wavelength structure wherein two edge-emitting devices are bonded with p-regions adjacent. The bonding medium is a conductive compound that forms a common electrode between the devices. Each device is separately addressable. Efficient coupling of emitted light into a single fiber is accomplished by restricting the vertical and horizontal separation of the light emitting stripes.

9 Claims, 5 Drawing Figures

MULTIPLE WAVELENGTH LIGHT EMITTING DEVICES

BACKGROUND OF THE INVENTION

This invention relates to light emitting devices for use primarily in lightwave transmission systems.

The very wide transmission window from about 0.8 to 1.6 μm in present low-loss optical fibers permits the use of wavelength multiplexing to increase the transmission capacity of a fiber. Multiple wavelength light emitting devices which operate in this range have previously been disclosed. See, for example, the article entitled "Dual-Wavelength Surface Emitting InGaAsP LEDs," by T. P. Lee, C. A. Burrus and A. G. Dentai, *Electron Letters*, 16, page 845 (1980) or the article entitled "A Transparent InGaAsP-InP Luminescent Diode for Optical Wavelength Multiplex Operation of Fiber Systems," by W. E. Proebster and H. Grothe, *IEEE Transactions Electron Devices*, ED-30, page 119 (1983).

The prior art devices are generally monolithic structures. Producing a second wavelength in a monolithic structure usually requires growing two active layers with different bandgaps either in a single growth procedure or a consecutive growth procedure with an intermediate etch step. The former procedure involves complex processing to electrically access the active layers individually while the latter involves a difficult regrowth process.

It has been proposed to provide a multiwavelength light emitting device by using individual LEDs emitting at different wavelengths and coupling them in series using short lengths of optical fiber. (See Proebster and Grothe, "A Transparent InGaAsP-InP Luminescent Diode ...," *IEEE Transactions Electron Devices*, ED-30, page 119 (1983).) While this approach has many advantages, it may also involve costly, complex, multiple LED to fiber alignments.

It is therefore an object of this invention to provide a multiwavelength light emitting device where the light can be coupled effectively into a single optical fiber.

SUMMARY OF THE INVENTION

These and other objects are achieved in accordance with the invention which is a multiwavelength light emitting device. The device includes two light emitting devices each comprising a confined light emitting region which emits light at a different wavelength. The devices are bonded with a conductive compound which forms a common electrode between them. The light emitting regions are sufficiently close together in order to couple light from both devices into a single optical fiber. Means are also included for electrically addressing each device separately.

BRIEF DESCRIPTION OF THE DRAWING

These and other features of the invention are delineated in detail in the following description.

In the drawing.

It will be appreciated that for purposes of illustration these Figures are not necessarily drawn to scale.

DETAILED DESCRIPTION

Figure 1:
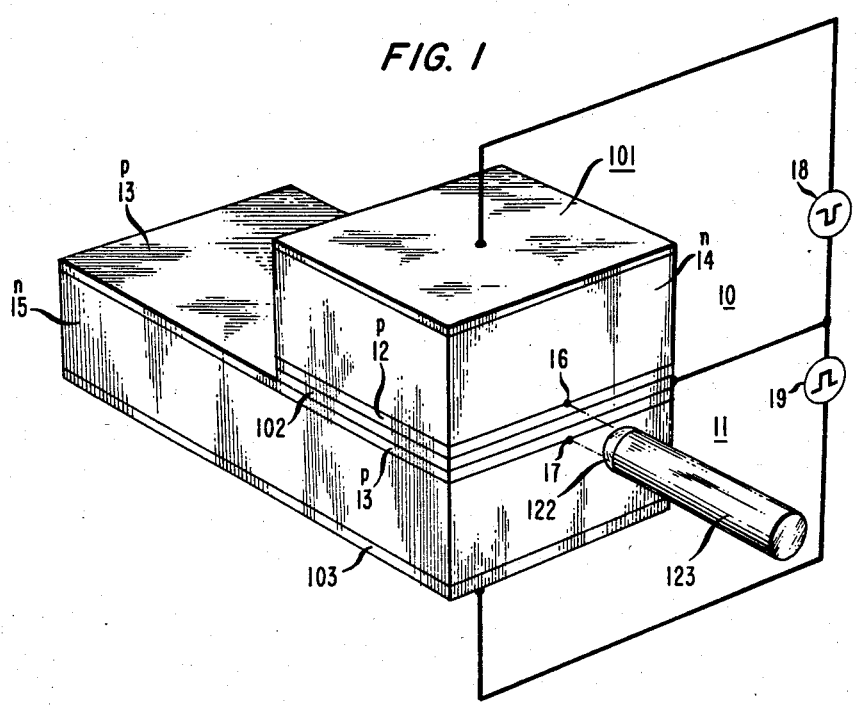
FIG. 1 is a perspective, partly schematic, view of a device in accordance with one embodiment of the invention.

Presented in FIG. 1 is an embodiment of a dual wavelength light emitting device in accordance with the invention.

The structure includes two light emitting devices, 10 and 11, which are bonded together so that there is a common conductive layer, 102, between them. One device (10) is shorter than the other (11) to allow electrical access to the common electrode (102) through an ohmic contact layer on the surface of the bottom device (this layer is not shown in FIG. 1 for the sake of clarity in the illustration but is presented in FIG. 5, for example, as layer 131). Typically, the top device (10) is approximately 200 μm long while the bottom device (11) is approximately 400 μm long. Ohmic contact layers, 101 and 103, are formed on the opposite surfaces of each device. Pulse sources, 18 and 19, are connected between electrodes, 101 and 102, and electrodes, 103 and 102, respectively, so that each device is forward biased individually and the devices can be operated independently.

Each device, 10 and 11, is an edge emitting light emitting diode (LED) which includes a least one p-region, 12 and 13, and one n-region, 14 and 15. The confined light emitting regions are illustrated schematically in FIG. 1 as the dots, 16 and 17, located at the p-n junction of each device. As also illustrated, the individual devices are constructed and bonded so that the light emitting regions are sufficiently close together to permit coupling the light from both regions into a single optical fiber, 123.

In general, each device, 10 and 11, is identical except that the active regions are of different material compositions to emit at different wavelengths. It is also generally desirable to fabricate thin p-regions and bond the two devices so that their p-regions are adjacent in order to couple the light efficiently into the fiber.

Figure 5:
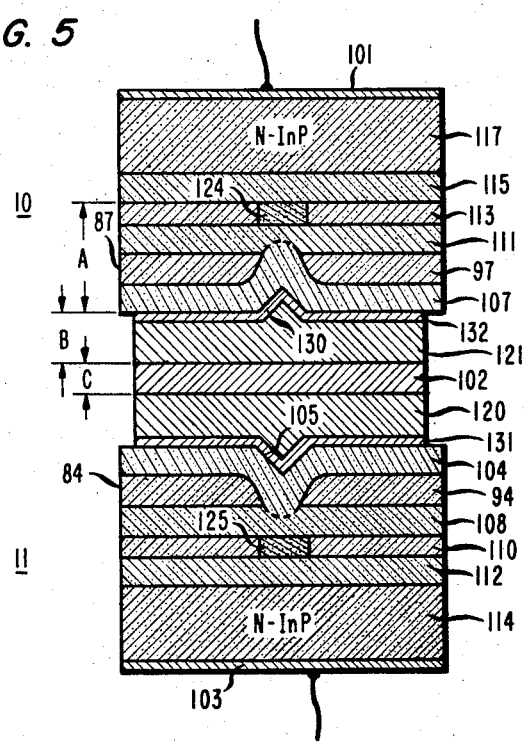
FIGS. 2-5 are cross-sectional views of a device during various stages of fabrication in accordance with a more detailed embodiment of the invention.
Figure 2:
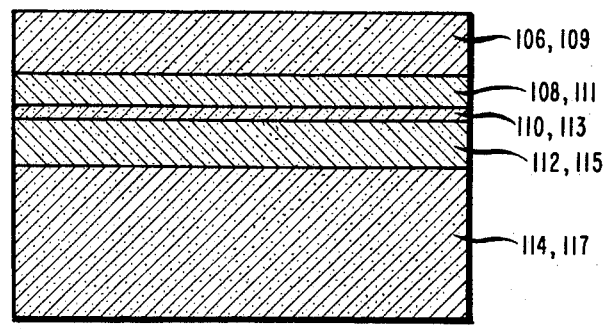
Figure 3:
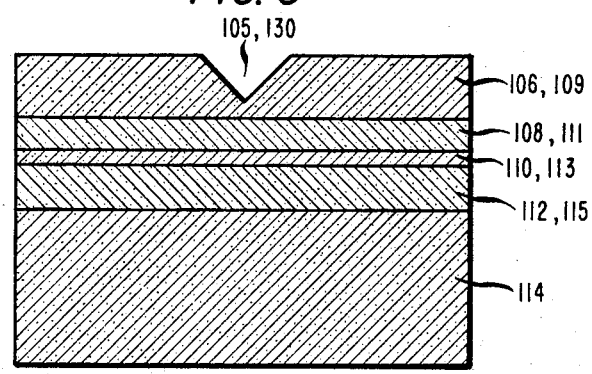
Figure 4:
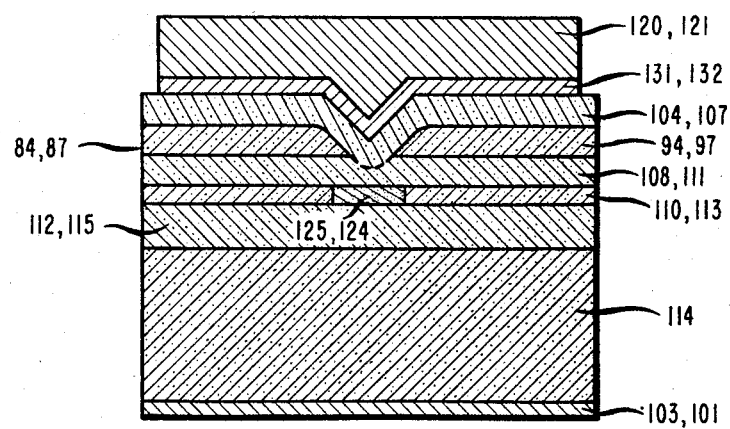

FIG. 5 illustrates the dual wavelength light emitting structure in accordance with a more detailed embodiment of the invention while FIGS. 2-4 show the fabrication of the individual devices for inclusion in the final structure. As shown in FIG. 2 each device consists of four epitaxial layers (106, 108, 110, 112, for device, 11 and 109, 111, 113, 115 for device, 10) grown by liquid phase epitaxy on a <100> oriented Sn-doped n-type InP substrate (114 and 117) with an impurity concentration of $5 \times 10^{18}$ cm$^{-3}$. Layer compositions are as follows:

an n-type, 4 μm thick, Sn-doped InP buffer layer with an impurity concentration of $1 \times 10^{18}$ cm$^{-3}$ (112 and 115);

an n-type, 0.2 μm thick Sn-doped InGaAsP active layer with an impurity concentration of $1 \times 10^{18}$ cm$^{-3}$ (110 and 113);

a p-type, 2 μm thick, Zn-doped InP confining layer with an impurity concentration of $5 \times 10^{17}$ cm$^{-3}$ (108 and 111); and an n-type, 3 μm thick, Sn-doped InP layer with an impurity concentration of $5 \times 10^{18}$ cm$^{-3}$ (106 and 109).

To form the light emitting stripes (124 and 125 of FIG. 5), a 3 μm wide V-groove (105 and 130) is etched into the device surfaces as shown in FIG. 3. The V-groove is formed by etching the cap layer (106 and 109) through a photoresist mask with stripe-shaped openings oriented along the <110> direction.

As shown in FIG. 4, after formation of the epitaxial layers, 106 and 109, and the grooves, 105 and 130, the devices are subjected to a Zn diffusion process to transform part of layers, 106 and 109, into p-type layers, 104 and 107.

The remaining n-type regions of layers, 106 and 109 (84, 94 and 87, 97) serve to restrict current flow from layer, 104, to layer, 108, in device, 11, and from layer, 107, to layer, 111, in device, 10, in order to confine the region of light emission from layers, 110 and 113, to the regions, 125 and 124. Due to the presence of the grooves, a part of the p-region will extend completely through layers, 106 and 109, to give the structure shown and electrically define the area of the stripes. The dashed lines indicate the extent of Zn diffusion. This type of light emitting device structure is shown in U.S. Pat. No. 4,278,949 issued to P. Marshall.

After each device has been thinned to 100 $\mu$m, the p-surfaces are metallized with BeAu layers (131 and 132) and the n surfaces are metallized with Au/Sn/Au layers, 101 and 103), which layers are typically 0.08 $\mu$m thick and 0.5 $\mu$m thick, respectively. Lastly, gold heat sinks, 120 and 121, are electroplated onto the top surface of each device typically to a thickness of approximately 2.0 $\mu$m. Conveniently, each device can be formed from separate single wafers and then cleaved apart.

In this example, the two devices were identical except for the active layers, 110 and 113, where the composition was varied to cause different wavelengths of light emission. The composition of layer, 110, was typically $In_{0.83}Ga_{0.17}As_{0.64}P_{0.36}$ so that the wavelength of the peak emission was approximately 1.1 $\mu$m while the composition of layer, 113, was typically $In_{0.70}Ga_{0.30}As_{0.64}P_{0.36}$ so that the wavelength of the peak emission was approximately 1.3 $\mu$m.

As shown in FIG. 5, the two devices are bonded p-surface to p-surface by means of a conductive layer, 102, for example a silver filled epoxy such as that sold by Ablebond under the designation "36-2 silver filled epoxy". The spacing between the light emitting stripes, 124 and 125, is minimized in the vertical direction in order to couple the emitted light efficiently into an optical fiber. The vertical spacing between the light emitting regions is dependent upon the thickness of the epoxy (C~2 $\mu$m), the combined thickness of the two heat sinks and BeAu contact layers (2B~4 $\mu$m), the thickness of the active layers (113 and 110), confining layers (111 and 108), the p-InP, and the last-to-grow n-InP layer for both LEDs (2A~10 $\mu$m). Since the core diameter of commonly used transmission fibers is less than 85 $\mu$m, the maximum vertical separation of the light emitting stripes should be 25 $\mu$m. The vertical separation of the present structure is 14–16 $\mu$m but can be reduced to approximately 13 $\mu$m by reducing the thickness of the epitaxial layers and heat sinks. The vertical separation parameter is dependent upon the system one intends to use and the core diameter of the optical fiber used. In general, the vertical separation of the light emitting stripes in the dual wavelength device presented may be enlarged to 100 $\mu$m to simplify device fabrication or reduced to a minimum of 5 $\mu$m to increase coupled power, depending upon desired use.

Horizontal alignment is achieved in one dimension by making the front surfaces of the device (facing the fiber) as flush as possible. In the other dimension, alignment within 20 $\mu$m can be achieved by fabricating each light emitting stripe with its center within 10 $\mu$m of the center of the device chip and then centering the top device over the bottom device. The formation of the V-grooves, 105 and 130, aids in the horizontal alignment since a slight dimple will be formed in the overlying metal thereby identifying the position of the stripe. A recommended maximum horizontal tolerance for the fiber employed is 25 $\mu$m.

The fiber, 123, (FIG. 1) used in this embodiment has a 62.5 $\mu$m core and a numerical aperture (NA) of 0.29. To improve the coupling efficiency, a 125 $\mu$m diameter lens, 122, is glued to the end of the fiber. Tests on several devices yielded data on launched power and light output as a function of bias current. The maximum launched power at 50 mA bias was 52 $\mu$W for $\lambda_1 = 1.3$ $\mu$m and 30 $\mu$W for $\lambda_2 = 1.1$ $\mu$m.

The values of the launched power of the inventive structure are in good agreement with accepted system loss and desired results. There is also approximately a linear relation between the light output and current from within the range 5 mA–150 mA. Within this range, the temperature dependence of the light output is expected to be comparable to that of surface emitting LEDs, i.e., $T_o = 180°$ K. (surface) and $T_o = 110°$ K. (edge emitting) where $T_o$ is a characteristic temperature to that particular device. (The temperature dependence of the launched power is empirically proportional to $\exp(-T/T_o)$ where T=temperature and $T_o$ =characteristic temperature.) Since our dual wavelength structure is composed of two individual edge-emitters laid one on top of the other with intervening metallization, (i.e. gold heat sinks, 120 and 121, and BeAu layers, 131 and 132), spectral problems due to the optical interaction of the two devices do not occur. That is, problems which might have arisen due to photo-excitation of one device by another are corrected in part by utilizing heat sinks, 120 and 121, and/or ohmic contact layers, 131 and 132, as shields against interaction of the two devices.

One of the primary advantages of the invention is that it requires only a single fiber and therefore a single alignment for good coupling efficiency. The coupling efficiency decreased at most by 3.6 dB when the fiber was repositioned so as to couple the light from both sources, as compared to the coupling from a single source.

It should be understood that the invention presented here is not limited to this particular embodiment. Any edge-emitting laser or light emitting diode may be employed in the present structure provided the distance between light emitting areas falls within the constraints previously mentioned. For example, the devices could have a greater or lesser number of layers than shown in FIG. 2, and any manner of stripe geometry formation may be employed.

Further, the two devices employed in the structure need not be identical, but could have completely different geometries and/or material compositions. It should be understood that in the attached claims, the use of the term "means for electrically addressing" is not intended to require the use of a power supply.

Various additional modifications will become apparent to those skilled in the art. All such variations which basically rely on the teachings through which the invention has advanced the art are properly considered within the scope of the invention.

What is claimed is:

1. A multiwavelength light emitting device comprising:
    two light emitting devices, each comprising a confined light emitting region which emits light at a different wavelength, said devices being bonded with a conductive material that forms a common electrode between them, the light emitting regions being sufficiently close together to couple light from both regions into a single optical fiber; and means for electrically addressing each device separately.

2. The multiwavelength device according to claim 1 further comprising a heat sink between each light emitting device and the common electrode.

3. The multiwavelength device according to claim 1 wherein the vertical separation of the light emitting regions lies within the range of 5 $\mu$m to 100 $\mu$m.

4. The multiwavelength device according to claim 1 wherein the vertical separation of the light emitting regions is no greater than 25 $\mu$m.

5. The multiwavelength device according to claim 1 wherein the means for electrically addressing each light emitting device comprises ohmic contact layers formed on the surfaces of the light emitting devices opposite the bonded surfaces.

6. The multiwavelength device according to claim 1 wherein the length of one light emitting device is greater than the length of the other light emitting device, in order to permit electrical access to the common electrode.

7. The multiwavelength device according to claim 2 wherein the heat sink serves also as a shield against photo-excitation of one device by the other.

8. The multiwavelength device according to claim 1 wherein each device includes an n-type region and a p-type region, and the devices are bonded so that their p-type regions are in close proximity without any intervening n-type region.

9. The multiwavelength device according to claim 1 further comprising an optical fiber which is aligned with said light emitting regions so that light from both regions is coupled into said fiber.

* * * * *